(12) United States Patent
Loke et al.

(10) Patent No.: US 9,379,662 B2
(45) Date of Patent: Jun. 28, 2016

(54) SYSTEM AND METHOD USING TEMPERATURE TRACKING FOR A CONTROLLED OSCILLATOR

(71) Applicant: Samsung Electronics Co., Ltd., Gyeonggi-do (KR)

(72) Inventors: Wing Fai Loke, San Jose, CA (US); Chih-Wei Yao, Sunnyvale, CA (US)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/593,251

(22) Filed: Jan. 9, 2015

(65) Prior Publication Data
US 2016/0079918 A1     Mar. 17, 2016

Related U.S. Application Data

(60) Provisional application No. 62/050,422, filed on Sep. 15, 2014.

(51) Int. Cl.
*H03L 1/02*     (2006.01)
*H03B 5/04*     (2006.01)
*H03B 5/12*     (2006.01)

(52) U.S. Cl.
CPC ............... *H03B 5/04* (2013.01); *H03B 5/1237* (2013.01); *H03B 2201/0208* (2013.01)

(58) Field of Classification Search
CPC ..................................... H03L 1/02; H03B 5/04
USPC ..................................................... 331/176, 66
See application file for complete search history.

(56) References Cited

U.S. PATENT DOCUMENTS

| | | | |
|---|---|---|---|
| 7,463,097 B2 | 12/2008 | Costa et al. | |
| 7,940,127 B2 | 5/2011 | Chiu et al. | |
| 8,125,284 B2 * | 2/2012 | Zhang | H03L 1/022 331/176 |
| 8,125,285 B2 | 2/2012 | Titus | |
| 8,248,167 B2 | 8/2012 | Bolton | |
| 2010/0225402 A1 | 9/2010 | Yang et al. | |
| 2013/0278347 A1 | 10/2013 | Li | |

* cited by examiner

*Primary Examiner* — Joseph Chang
(74) *Attorney, Agent, or Firm* — The Farrell Law Firm, P.C.

(57) ABSTRACT

A system using temperature tracking for a controlled oscillator (CO) is provided. The system includes at least one coarse tuning capacitor circuit including a plurality of selectable coarse tuning capacitors operable in at least three modes of operation, thereby allowing switching between each coarse capacitor of the plurality of selectable coarse capacitors when a selected coarse tuning capacitor has reached one of its high tuning range and low tuning range.

19 Claims, 7 Drawing Sheets

FIG. 4A  FIG. 4B

SYSTEM AND METHOD USING TEMPERATURE TRACKING FOR A CONTROLLED OSCILLATOR

PRIORITY

This application claims priority under 35 U.S.C. §119(e) to U.S. Provisional Patent Application Ser. No. 62/050,422, which was filed on Sep. 15, 2014 by Loke et al., the entire disclosure of which is incorporated herein by reference.

BACKGROUND OF THE INVENTION

1. Field of the Invention

The invention relates generally to a system and method using temperature tracking for controlled oscillators (COs), and more particularly, to a system and method using temperature tracking for COs, in which the temperature tracking uses at least one coarse tuning capacitor circuit including a plurality of selectable coarse tuning capacitors.

2. Description of the Related Art

Modern communication systems typically employ a CO (e.g., voltage CO (VCO) or digitally CO (DCO)), in conjunction with a phase locked loop (PLL), to tune to a desired channel frequency. When PLL is locked, slow and gradual temperature tracking is typically used to compensate for the changes in a fine-tuning range of a CO, due to temperature changes.

Conventional systems sometimes use one or more capacitor configurations to perform temperature tracking. One such capacitor configuration can include a fine tuning capacitor circuit and a coarse tuning capacitor circuit. However, a frequency range of the fine tuning capacitor circuit is not capable of covering a wide range of temperature variations. Moreover, the coarse tuning capacitor circuit cannot provide temperature tracking when the PLL is locked.

An extra temperature tracking variable capacitor, e.g., a varactor, can be used in conjunction with the fine tuning capacitor circuit and coarse tuning capacitor circuit to further compensate for temperature variations. However, such types of capacitors tend to increase CO gain ($K_{CO}$), which, in turn, can cause an increase in phase noise contribution due to the temperature tracking. In addition, varactors also tend to add parasitic capacitance to the output of the CO.

Therefore, there exists a need for a system and method using temperature tracking for COs, in which the temperature tracking uses at least one coarse tuning capacitor circuit including a plurality of selectable coarse tuning capacitors.

SUMMARY OF THE INVENTION

The invention has been made to address the above problems and disadvantages, and to provide at least the advantages described below.

In accordance with an aspect of the invention, a system using temperature tracking for a CO is provided. The system includes at least one coarse tuning capacitor circuit including a plurality of selectable coarse tuning capacitors operable in at least three modes of operation, thereby allowing switching between each coarse capacitor of the plurality of selectable coarse capacitors when a selected coarse tuning capacitor has reached one of its high tuning range and low tuning range.

In accordance with another aspect of the invention, a method using temperature tracking for a CO is provided. A temperature tracking circuit is electrically connected to at least one coarse tuning capacitor circuit including a plurality of selectable coarse tuning capacitors operable in at least an On-Cap mode operation, an Off-Cap mode of operation, and a Tunable-Cap mode of operation. One of the coarse tuning capacitors is selected for operation in the Tunable-Cap mode of operation. If during temperature tracking of the CO the coarse tuning capacitor selected for operation in the Tunable-Cap mode reaches one of an upper limit of its tuning range and a lower limit of its tuning range, a mode of operation of the coarse tuning capacitor selected for operation in the Tunable-Cap mode is changed and another coarse tuning capacitor is selected for operation in the Tunable-Cap mode of operation based on the limit that was reached by the previously selected coarse tuning capacitor.

BRIEF DESCRIPTION OF THE DRAWINGS

The above and other aspects, features, and advantages of certain embodiments of the present invention will be more apparent from the following detailed description taken in conjunction with the accompanying drawings, in which:

FIGS. 4A-4C are schematic diagrams of a coarse tuning capacitor shown in an "On-Cap" mode, an "Off-Cap" mode and a "Tunable-Cap" mode of operation, respectively, according to an embodiment of the present invention.

DETAILED DESCRIPTION OF EMBODIMENTS OF THE PRESENT INVENTION

Various embodiments of the present invention will now be described in detail with reference to the accompanying drawings. In the following description, specific details such as detailed configuration and components are merely provided to assist in the overall understanding of these embodiments of the present invention. Therefore, it should be apparent to those skilled in the art that various changes and modifications of the embodiments described herein can be made without departing from the scope and spirit of the invention. In addition, descriptions of well-known functions and constructions are omitted for clarity and conciseness.

As noted above, there exists a need for a system and method using temperature tracking for COs, in which the temperature tracking uses at least one coarse tuning capacitor circuit including a plurality of selectable coarse tuning capacitors, and such a system and method are described herein.

Figure 1:
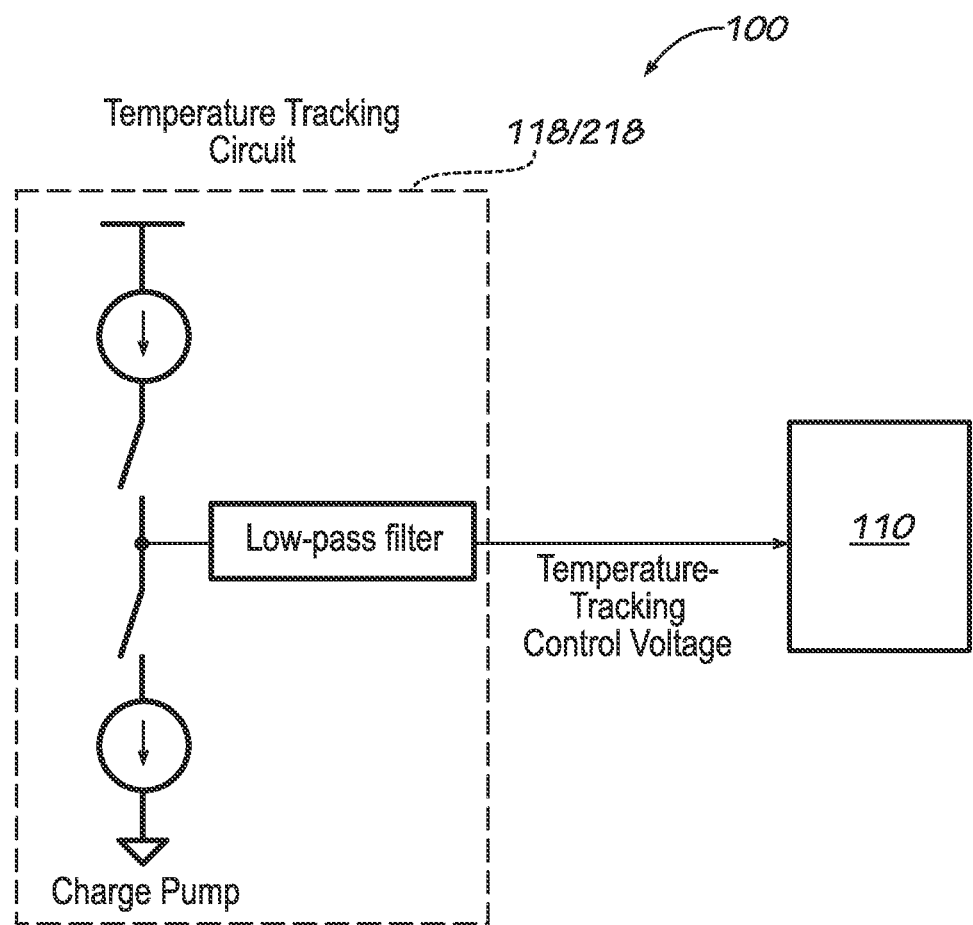
FIG. 1 is a diagram of a system including a temperature tracking circuit and a positive channel metal-oxide semiconductor (PMOS) DCO, according to an embodiment of the present invention.

FIG. 1 is a diagram of a system 100 including a temperature tracking circuit 118 and a PMOS DCO 110 (hereinafter DCO 110), according to an embodiment of the present invention. The temperature tracking circuit 118 can be embodied in either a digital-to-analog converter (DAC) or a charge-pump (as shown in FIG. 1), or other temperature dependent voltage source. The temperature tracking circuit 118 can include one or more filters, e.g., a low pass filter (shown in FIG. 1), that provides a temperature tracking voltage to the DCO 110.

Figure 2A:
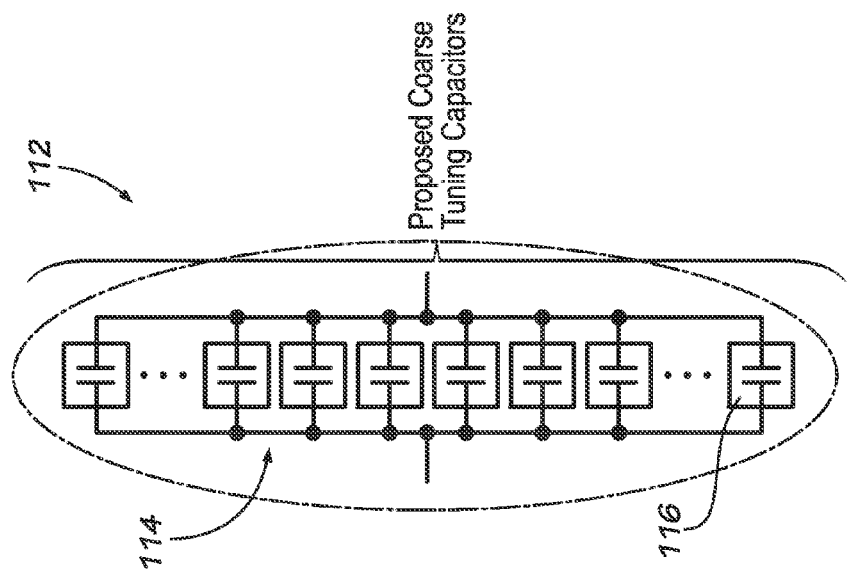
FIG. 2A is a schematic diagram of a PMOS DCO which uses a coarse tuning capacitor circuit, according to an embodiment of the present invention.
Figure 2B:
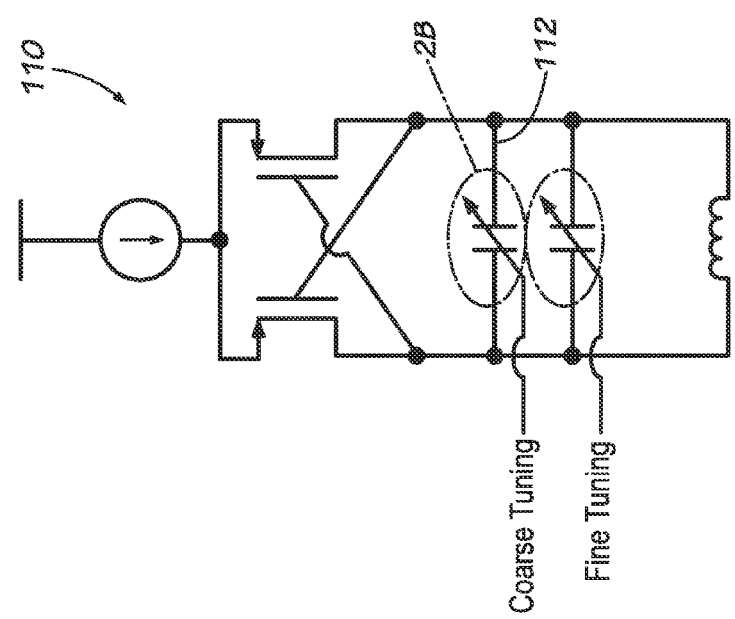
FIG. 2B is an enlarged view of the indicated area of detail of FIG. 2A.

FIG. 2A is a schematic diagram of the DCO 110 which uses a coarse tuning capacitor circuit 112 (shown expanded in FIG. 2B), according to an embodiment of the present invention. Although the DCO 110 is shown as a PMOS DCO, the present invention is not so limited, as the present invention can be implemented in a negative channel MOS (NMOS) DCO and a complementary MOS (CMOS) DCO.

Additionally, while FIG. 2A illustrates the DCO 110, the invention is not so limited, as the present invention can be implemented using other COs, such as a PMOS VCO, NMOS VCO, and CMOS VCO, as will be described in more detail below. Further, the coarse tuning capacitor circuit 112 can be applied to any circuit designs that use differential capacitor banks.

The coarse tuning capacitor circuit 112 includes a plurality of coarse tuning capacitors 114 including coarse tuning capacitors 116 (capacitors 116). For illustrative purposes, it is assumed that all of the capacitors 116 in the plurality of coarse tuning capacitors 114 are metal-oxide-metal (MOM) capacitors, which are identical to each other. Alternatively, the capacitors 116 may be different from each other, in capacitance, size, type, etc. The amount of capacitors 116 in the plurality of coarse tuning capacitors 114 can vary depending on a particular use of the DCO 10.

Figure 3:
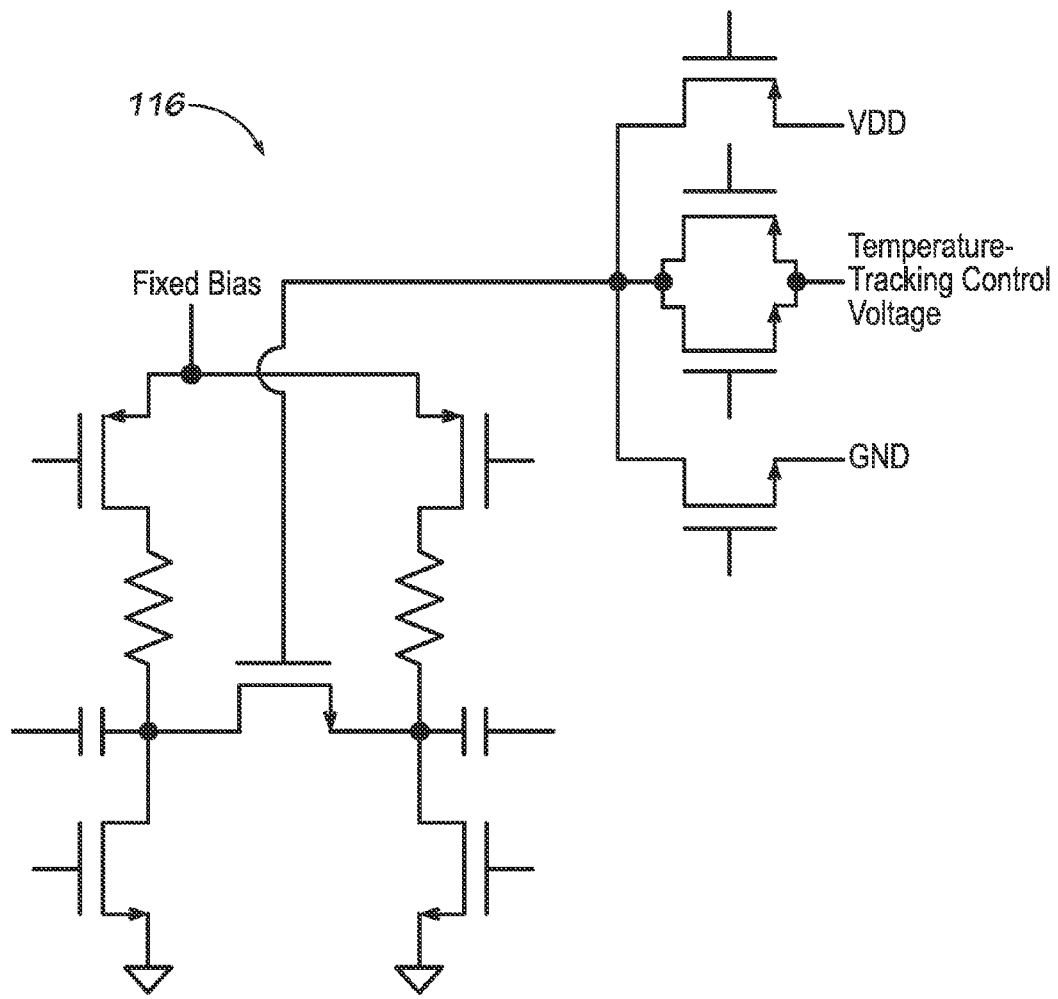
FIG. 3 is a schematic diagram of a coarse tuning capacitor with temperature tracking capability, according to an embodiment of the present invention.

FIG. 3 is a schematic diagram of the capacitor 116 with temperature tracking capability, according to an embodiment of the present invention. Each capacitor 116 is operable in at least three modes of operation, an On-Cap mode of operation, an Off-Cap mode of operation, and a Tunable-Cap mode of operation, thereby allowing switching between each capacitor 116 when a selected capacitor 116 has reached its high tuning range and/or low tuning range, as will be described in more detail below.

Figure 4C:
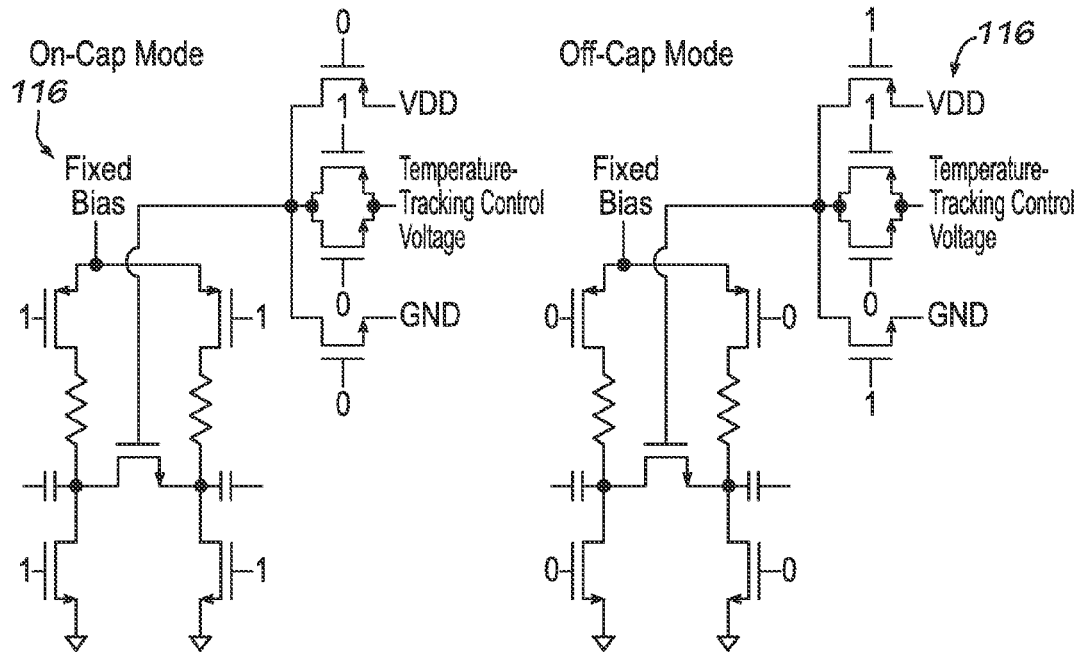
Figure 4C:
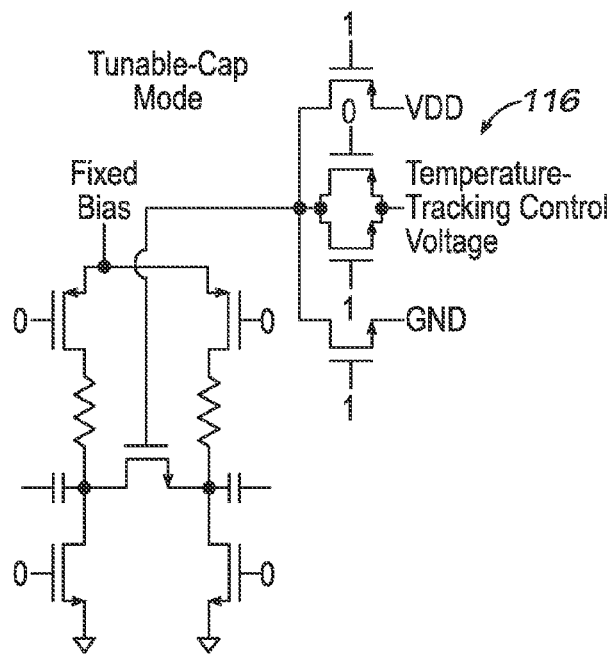

FIGS. 4A-4C are schematic diagrams of the capacitor 116 shown in the On-Cap mode of operation (FIG. 4A), the Off-Cap mode of operation (FIG. 4B) and the Tunable-Cap mode of operation (FIG. 4C), according to an embodiment of the present invention. In the On-Cap mode of operation and Off-Cap mode of operation, the capacitor 116 functions as a conventional capacitor, e.g., as a conventional coarse tuning capacitor.

In accordance with embodiments of the present invention, the capacitor 116 is configured to have a higher capacitance when it is operating in the On-Cap mode of operation compared to when the capacitor 116 is operating in the Off-Cap mode of operation. Such a capacitance configuration provides a capacitance step, which, in turn, provides a corresponding frequency step in the DCO 110 during temperature-tracking. Moreover, when the capacitor 116 is in the Tunable-Cap mode of operation, and the temperature-tracking control voltage is used, a capacitance of the capacitor 116 is allowed to change gradually. This gradual change in capacitance of the capacitor 116 in the Tunable-Cap mode provides a gradual change in the DCO frequency, which, in turn, minimizes the likelihood of a digital PLL (DPLL) becoming unlocked, which, as described above, is a shortcoming associated with conventional coarse tuning capacitors used with temperature tracking.

The capacitors 116 are switchable between the different modes of operation which allows the capacitors 116 to be used in achieving a tuning range that is suitable for covering changes in temperature, e.g., during DPLL. Having the ability to switch the capacitors 116 between the different modes of operation also allows each capacitor 116 to have a smaller tuning range, when compared to using a temperature tracking analog varactor; this is because if the temperature tracking analog varactor has to cover a certain frequency range over temperature, the frequency range can be split and covered using different coarse tuning capacitors.

Each of the capacitors 116 of the DCO 10 are electrically connected to the temperature tracking circuit 118 for receiving a temperature tracking control voltage that is generated to tune the DCO 10 to a desired channel frequency. Moreover, one or more processors associated with the temperature tracking circuit 118 (or other component of the system 110) may be provided to control the switching of the capacitors 116 when a capacitor 116 that has been selected for operation in the Tunable-Cap mode has reached its high tuning range and/or low tuning range.

Figure 5C:
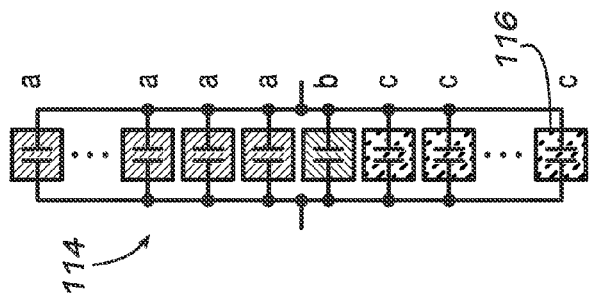
FIGS. 5A-5C are diagrams collectively illustrating switching between multiple coarse tuning capacitors needed to extend a tuning range of a temperature tracking scheme, according to an embodiment of the present invention.
Figure 5B:
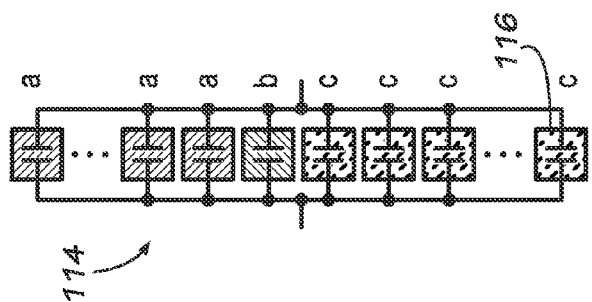
Figure 5A:
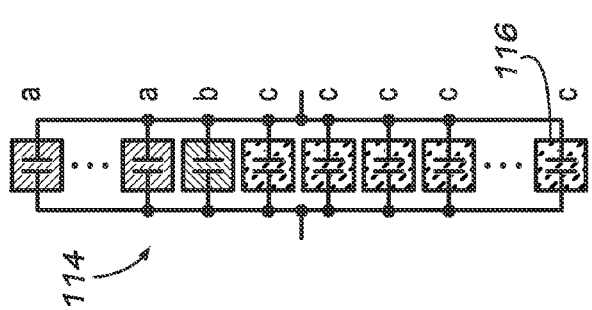

FIGS. 5A-5C are diagrams collectively illustrating switching between capacitors 116 needed to extend a tuning range of a temperature tracking scheme, according to an embodiment of the present invention. In accordance with embodiments of the present invention, at any time, only one capacitor 116 is selected in the Tunable-Cap mode and the other capacitors are configured either as On-Cap or Off-cap modes. For illustrative purposes, the capacitors 116 that are in the On-Cap mode are designated with an "a," the capacitor 116 that is in the Tunable-Cap mode is designated "b," and the capacitors 116 that are in the Off-Cap mode are designated "c."

When a capacitor 116 that is in Tunable-Cap mode of operation reaches an upper limit of its tuning range, it is switched to the Off-Cap mode of operation and a capacitor 116 that was in the On-Cap mode is switched to the Tunable-Cap mode of operation to allow the temperature tracking scheme to achieve higher frequencies (see change from FIG. 5C to FIG. 5B and FIG. 5B to FIG. 5A, for example).

Conversely, when a capacitor 116 that is in Tunable-Cap mode reaches the lower limit of its tuning range, it will be switched to the On-Cap mode and a capacitor 116 that was in the Off-Cap mode will be switched to Tunable-Cap mode to allow the temperature tracking scheme to achieve lower frequencies (see change from FIG. 5A to FIG. 5B and FIG. 5B to FIG. 5C, for example).

As can be appreciated, multiple capacitors 116 can be used to extend the tuning range of the temperature-tracking scheme. In addition, the $K_{DCO}$ can be further reduced by using smaller capacitors 116, e.g., MOM capacitors having smaller capacitance.

Figure 6B:
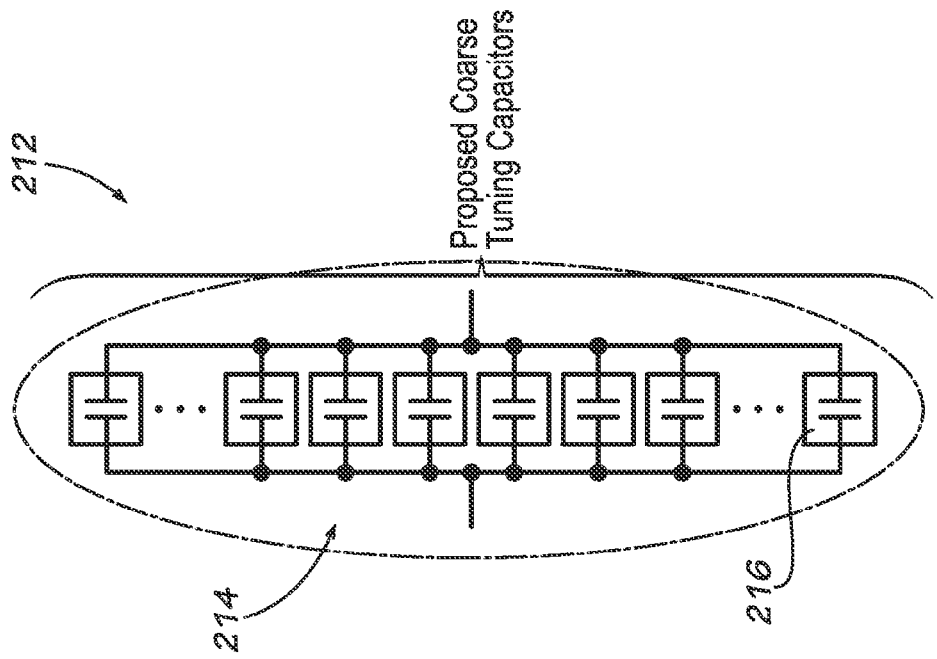
FIG. 6B is an enlarged view of the indicated area of detail of FIG. 6A.
Figure 6A:
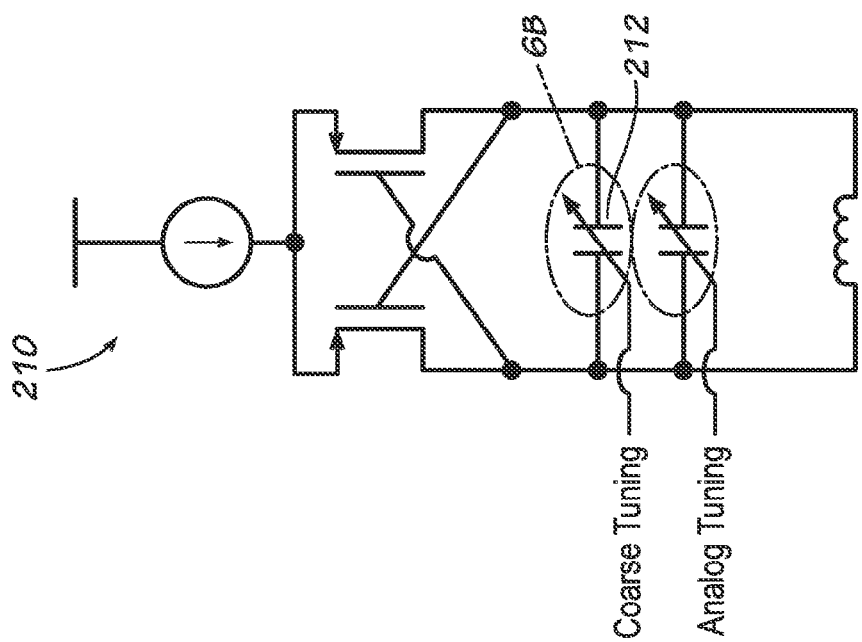
FIG. 6A is a schematic diagram of a PMOS VCO which uses a coarse tuning capacitor circuit, according to an embodiment of the present invention.

As noted above, the preset invention can be implemented using other COs, such as a PMOS VCO, NMOS VCO, and CMOS VCO. FIG. 6A is a schematic diagram of the PMOS VCO 210 which uses a coarse tuning capacitor circuit 212 (shown expanded in FIG. 6B). The coarse tuning capacitor circuit 212 includes a plurality of coarse tuning capacitors 214 including coarse tuning capacitors 216 (capacitors 216). Other than the manner in which the PMOS VCO 210 functions, the coarse tuning capacitor circuit 212 and the plurality of coarse tuning capacitors 214 including the capacitors 216 function as described above with respect to the coarse tuning capacitor circuit 112 and the plurality of coarse tuning capacitors 114 including the capacitors 116. Accordingly, a detailed description of the embodiment illustrated in FIGS. 6A and 6B is omitted for conciseness.

Figure 7:
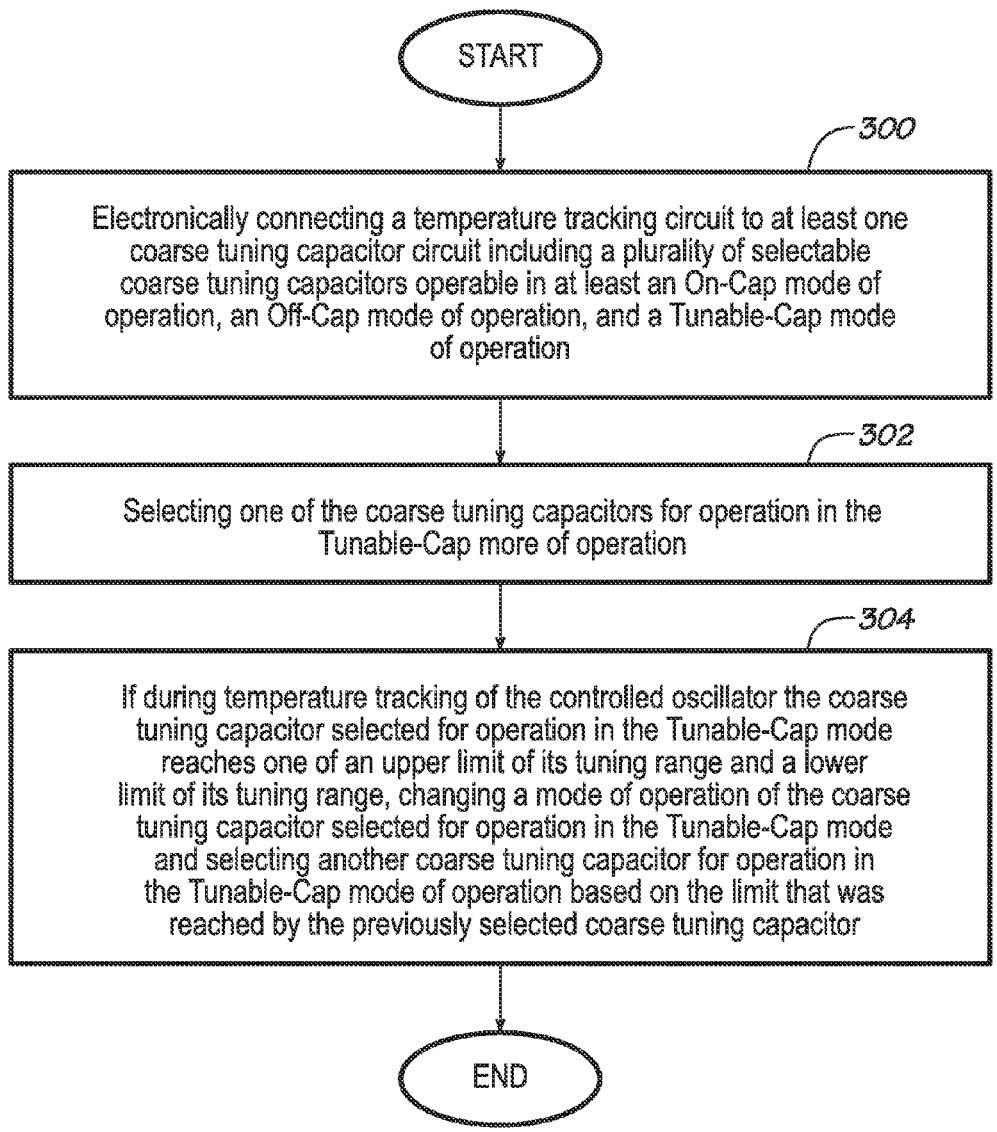
FIG. 7 is a flowchart illustrating a method using temperature tracking for a CO, according to an embodiment of the present invention.

FIG. 7 is a flowchart illustrating a method using temperature tracking for a CO, e.g., a DCO and/or a VCO.

At step 300, a temperature tracking circuit 118 is electrically connected to at least one coarse tuning capacitor circuit 112/212 including a plurality of selectable coarse tuning capacitors 114/214 operable in at least an On-Cap mode of operation, an Off-Cap mode of operation, and a Tunable-Cap mode of operation.

Thereafter, at step 302, one of the capacitors 116/216 is selected for operation in the Tunable-Cap mode of operation (see FIG. 4B for example). The selection of the capacitors 116/216 can be determined by one or more processors of the temperature tracking circuit 118/218. Alternatively, a controller (or other suitable device) may be used to perform this operation.

A temperature tracking control voltage provided by the low pass filter of the temperature tracking circuit 118 to the CO is used to tune the capacitor 116/216 that is selected for operation in the Tunable-Cap mode of operation. If during temperature tracking of the CO the capacitor 116/216 that is selected for operation in the Tunable-Cap mode of operation reaches either its upper limit of its tuning range or a lower limit of its tuning range, then at step 304, a mode of operation of the coarse tuning capacitor selected for operation in the Tunable-Cap mode of operation is changed to either On-Cap mode or Off-Cap mode of operation, and another coarse tuning capacitor is selected for operation in the Tunable-Cap mode of operation based on the limit that was reached by the previously selected coarse tuning capacitor.

For example, if an upper limit of the capacitor 116/216 that was selected for operation in the Tunable-Cap mode of operation is reached, then it is switched to the Off-Cap mode of operation and a capacitor 116/216 that was in the On-Cap mode of operation is switched to Tunable-Cap mode (see change from FIG. 5B to FIG. 5A); this allows the temperature-tracking scheme to achieve higher frequencies.

Conversely, if a lower limit of the capacitor 116/216 that was selected for operation in the Tunable-Cap mode of operation is reached, then it is switched to the On-Cap mode of operation and a capacitor 116/216 that was in the Off-Cap mode of operation is switched to Tunable-Cap mode of operation (see change from FIG. 5B to FIG. 5C); this allows the temperature-tracking scheme to achieve lower frequencies.

In accordance with the invention, the system 100 and method according to the invention overcomes the aforementioned shortcomings described above. That is, depending on whether the OC is DCO or VCO, each of the capacitors 116/216 has lower $K_{DCO}$ and $K_{VCO}$ (and, hence, contributes less phase noise), the temperature tracking scheme using the system 100 does not introduce any parasitic capacitance (as no additional component is connected to the outputs of the DCO 110/VCO 210), the $K_{DCO}$ and $K_{VCO}$ are tunable as a result of using multiple capacitors 116/216, and since multiple capacitors 116/216 are used, a large tuning range variation due to changes in temperature can be covered.

While the invention has been particularly shown and described with reference to certain embodiments thereof, it will be understood by those of ordinary skill in the art that various changes in form and details may be made therein without departing from the spirit and scope of the invention as defined by the following claims and their equivalents.

What is claimed is:

1. A system using temperature tracking for a controlled oscillator (CO), the system comprising:
at least one coarse tuning capacitor circuit including a plurality of selectable coarse tuning capacitors operable in at least three modes of operation, thereby allowing switching between each coarse capacitor of the plurality of coarse capacitors when a selected coarse tuning capacitor has reached one of its high tuning range and low tuning range,
wherein if during temperature tracking of the CO a coarse tuning capacitor selected for operation in a Tunable-Cap mode reaches one of an upper limit of its tuning range and a lower limit of its tuning range, changing a mode of operation of the coarse tuning capacitor selected for operation in the Tunable-Cap mode and selecting another coarse tuning capacitor for operation in the Tunable-Cap mode of operation based on the limit that was reached by a previously selected coarse tuning capacitor.

2. The system according to claim 1, wherein the at least three modes of operation includes an On-Cap mode of operation, an Off-Cap mode of operation and the Tunable-Cap mode of operation.

3. The system according to claim 2, wherein, at any given time, only one coarse tuning capacitor is selected in the Tunable-Cap mode of operation while the other coarse tuning capacitors are configured in one of the On-Cap and Off-Cap modes of operation.

4. The system according to claim 3, wherein, when a coarse tuning capacitor selected for operation in the Tunable-Cap mode of operation reaches an upper limit of its tuning range, it is switchable to the Off-Cap mode of operation and a coarse tuning capacitor that was in the On-Cap mode of operation is switchable to the Tunable-Cap mode of operation, thereby allowing a temperature tracking scheme of the system to achieve higher frequencies.

5. The system according to claim 3, wherein, when a coarse tuning capacitor selected for operation in the Tunable-Cap mode of operation reaches a lower limit of its tuning range, it is switchable to the On-Cap mode of operation and a coarse tuning capacitor that was in the Off-Cap mode of operation is switchable to the Tunable-Cap mode of operation, thereby allowing a temperature tracking scheme of the system to achieve lower frequencies.

6. The system according to claim 1, wherein the CO is one of a positive channel metal-oxide semiconductor (PMOS) CO, a negative channel MOS (NMOS) CO, and a complementary MOS (CMOS) CO.

7. The system according to claim 1, wherein the CO is one of a voltage CO (VCO) and a digitally CO (DCO).

8. The system according to claim 1, wherein the system further includes a temperature tracking circuit that is electrically connected to the at least one coarse tuning capacitor circuit.

9. The system according to claim 8, wherein the temperature tracking circuit is embodied in one of a digital-to-analog converter (DAC), a charge-pump, and a temperature dependent voltage source.

10. The system according to claim 9, wherein a temperature tracking control voltage of the temperature tracking circuit is used to tune a coarse tuning capacitor selected for operation in the Tunable-Cap mode.

11. A method using temperature tracking for a controlled oscillator (CO), the method comprising:
electrically connecting a temperature tracking circuit to at least one coarse tuning capacitor circuit including a plurality of selectable coarse tuning capacitors operable in at least an On-Cap mode of operation, an Off-Cap mode of operation, and a Tunable-Cap mode of operation;

selecting one of the coarse tuning capacitors for operation in the Tunable-Cap mode of operation; and if during temperature tracking of the CO the coarse tuning capacitor selected for operation in the Tunable-Cap mode reaches one of an upper limit of its tuning range and a lower limit of its tuning range, changing a mode of operation of the coarse tuning capacitor selected for operation in the Tunable-Cap mode and selecting another coarse tuning capacitor for operation in the Tunable-Cap mode of operation based on the limit that was reached by the previously selected coarse tuning capacitor.

12. The method according to claim 11, wherein, at any given time, only one coarse tuning capacitor is configured in the Tunable-Cap mode of operation while the other coarse tuning capacitors are configured in one of the On-Cap and off-Cap modes of operation.

13. The method according to claim 12, further comprising, if a selected coarse tuning capacitor in the Tunable-Cap mode of operation reaches an upper limit of its tuning range, switching the coarse tuning capacitor that was selected for operation in the Tunable-Cap mode of operation to the Off-Cap mode of operation and selecting a coarse tuning capacitor that was in the On-Cap mode of operation for operation in the Tunable-Cap mode of operation, thereby allowing a temperature tracking scheme of the CO to achieve higher frequencies.

14. The method according to claim 12, further comprising, if a selected coarse tuning capacitor in the Tunable-Cap mode of operation reaches a lower limit of its tuning range, switching the coarse tuning capacitor that was selected for operation in the Tunable-Cap mode of operation to the On-Cap mode of operation and selecting a coarse tuning capacitor that was in the Off-Cap mode of operation for operation in the Tunable-Cap mode of operation, thereby allowing a temperature tracking scheme of the CO to achieve lower frequencies.

15. The method according to claim 11, wherein the CO is one of a positive channel metal-oxide semiconductor (PMOS) CO, a negative channel MOS (NMOS) CO, and a complementary MOS (CMOS) CO.

16. The method according to claim 11, wherein the CO is one of a voltage CO (VCO) and a digitally CO (DCO).

17. The method according to claim 11, wherein electrically connecting the temperature tracking circuit to the at least one coarse tuning capacitor circuit includes using one of a digital-to-analog converter (DAC), a charge-pump for the temperature tracking circuit, and a temperature dependent voltage source.

18. The method according to claim 14, further comprising using a temperature tracking control voltage of the temperature tracking circuit to tune a coarse tuning capacitor in the Tunable-Cap mode.

19. A system using temperature tracking for a controlled oscillator (CO), the system comprising:

at least one coarse tuning capacitor circuit including a plurality of selectable coarse tuning capacitors operable in at least three modes of operation, thereby allowing switching between each coarse capacitor of the plurality of coarse capacitors when a selected coarse tuning capacitor has reached one of its high tuning range and low tuning range, wherein the at least three modes of operation includes an On-Cap mode of operation, an Off-Cap mode of operation and a Tunable-Cap mode of operation, and wherein, at any given time, only one coarse tuning capacitor is selected in the Tunable-Cap mode of operation while the other coarse tuning capacitors are configured in one of the On-Cap and Off-Cap modes of operation.

\* \* \* \* \*